United States Patent
Kim et al.

(10) Patent No.: US 8,809,999 B2
(45) Date of Patent: Aug. 19, 2014

(54) SEMICONDUCTOR INTEGRATED CIRCUIT DEVICE AND METHOD OF FABRICATING THE SAME

(75) Inventors: Weon-Hong Kim, Suwon-si (KR); Min-Woo Song, Seongnam-si (KR); Jung-Min Park, Ansan-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 594 days.

(21) Appl. No.: 12/704,339

(22) Filed: Feb. 11, 2010

(65) Prior Publication Data

US 2010/0207247 A1 Aug. 19, 2010

(30) Foreign Application Priority Data

Feb. 16, 2009 (KR) ........................ 10-2009-0012509

(51) Int. Cl.
*H01L 29/72* (2006.01)

(52) U.S. Cl.
USPC .................... 257/532; 257/296; 257/E29.343

(58) Field of Classification Search
USPC .................................. 257/296, 532, E29.343
See application file for complete search history.

(56) References Cited

U.S. PATENT DOCUMENTS

| 2006/0022245 A1* | 2/2006 | Jeong et al. ............... 257/296 |
| 2006/0258113 A1* | 11/2006 | Sandhu et al. ............ 438/396 |
| 2007/0166913 A1 | 7/2007 | Won et al. |

FOREIGN PATENT DOCUMENTS

| KR | 10-0533981 | 11/2005 |
| KR | 10-2006-0038615 | 5/2006 |
| KR | 10-2006-0102470 | 9/2006 |

OTHER PUBLICATIONS

English Abstract for Publication No. 10-2004-0050149 (for 10-0533981).
English Abstract for Publication No. 10-2006-0038615.
English Abstract for Publication No. 10-2006-0102470.

* cited by examiner

*Primary Examiner* — Edward Wojciechowicz
(74) *Attorney, Agent, or Firm* — F. Chau & Associates, LLC

(57) ABSTRACT

A semiconductor integrated circuit device includes a lower electrode formed on a substrate, a first dielectric layer formed of a metal nitride layer, a metal oxynitride layer, or a combination thereof, on the lower electrode, a second dielectric layer formed on the first dielectric layer that includes a zirconium oxide layer, and an upper electrode formed on the second dielectric layer.

10 Claims, 6 Drawing Sheets

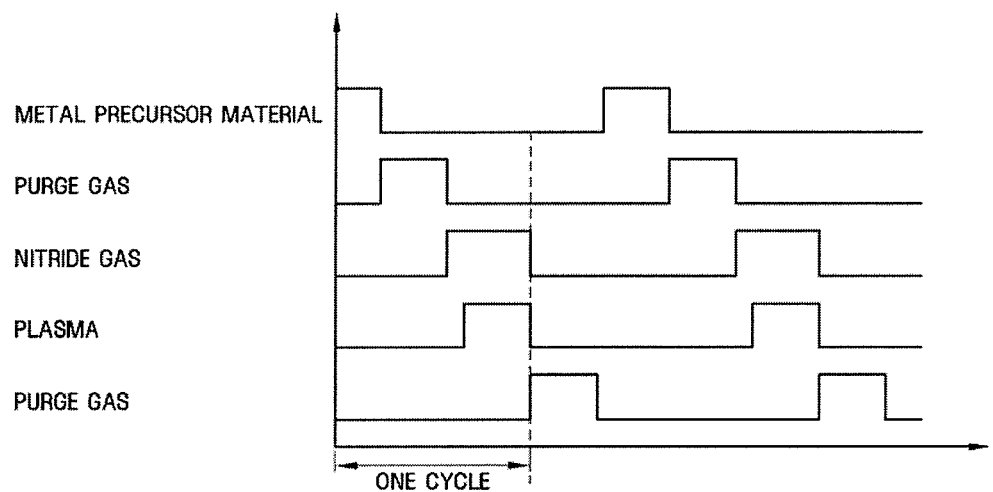
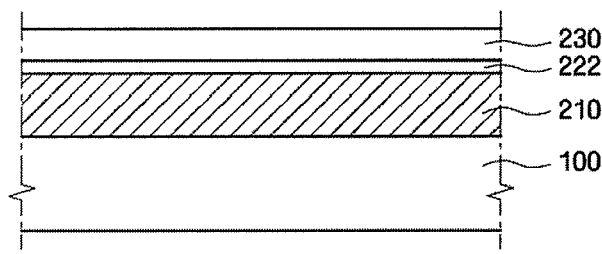

SEMICONDUCTOR INTEGRATED CIRCUIT DEVICE AND METHOD OF FABRICATING THE SAME

CROSS-REFERENCE TO RELATED APPLICATIONS

This application claims priority under 35 U.S.C. §119 from Korean Patent Application No. 10-2009-0012509, filed on Feb. 16, 2009 in the Korean Intellectual Property Office, the contents of which are herein incorporated by reference in their entirety.

BACKGROUND

1. Field of the Invention

The present disclosure is directed to a semiconductor integrated circuit device and a method of fabricating the same, and more particularly to a semiconductor integrated circuit device that has an improved reliability and a method of fabricating the same.

2. Description of the Prior Art

With the increasing capacity and integration of semiconductor devices, high dielectric constant (high-k) thin films are being used as, for example, a gate insulating layer of a transistor, a dielectric layer of a capacitor, or a gate dielectric layer of a nonvolatile memory device. By using such high dielectric constant (high-k) thin films, leakage current occurring in the thin film can be sufficiently reduced as an equivalent oxide thickness (EOT) is maintained.

Using a high-k thin film, a metal oxide layer can be used as a dielectric layer of a capacitor. In this case, however, a part of a lower electrode may be oxidized in a process of manufacturing a dielectric metal oxide layer. If a part of the lower electrode is oxidized, the EOT of the dielectric layer is increased, causing deterioration of the device.

SUMMARY

Accordingly, embodiments of the present invention provide a semiconductor integrated circuit device having an improved reliability.

Embodiments of the invention provide a method of fabricating a semiconductor integrated circuit device having an improved reliability.

Additional subjects and features of embodiments of the invention will be set forth in part in the description which follows and in part will become apparent to those having ordinary skill in the art upon examination of the following or may be learned from practice of the invention.

In a first aspect of the invention, there is provided a semiconductor integrated circuit device, according to one embodiment of the invention, which includes a lower electrode formed on a substrate; a first dielectric layer formed of one selected from the group consisting of a metal nitride layer, a metal oxynitride layer, or a combination thereof, on the lower electrode; a second dielectric layer formed on the first dielectric layer that includes a zirconium oxide layer; and an upper electrode formed on the second dielectric layer.

in another aspect of the invention, there is provided a semiconductor integrated circuit device, which includes a lower electrode formed on a substrate; a first dielectric layer formed of one selected from the group consisting of a zirconium nitride layer, a zirconium oxynitride layer, or a combination thereof, on the lower electrode; a second dielectric layer that includes one or more metal oxide layers formed on the first dielectric layer; and an upper electrode formed on the second dielectric layer.

In still another aspect of the invention, there is provided a method of fabricating a semiconductor integrated circuit device, which includes forming a lower electrode on a substrate; forming a first dielectric layer of zirconium nitride, forming a second dielectric layer as a ZAZ layer, including a zirconium oxide layer ZrO, an aluminum oxide layer AlO, and a zirconium oxide layer ZrO that are sequentially laminated on the first dielectric layer; and forming an upper electrode on the second dielectric ZAZ layer, where the first dielectric layer prevents the lower electrode from oxidizing during the forming of the second dielectric layer.

BRIEF DESCRIPTION OF THE DRAWINGS

FIGS. 2, 3A and 4A are sectional views illustrating a method of fabricating a semiconductor integrated circuit device according to an embodiment of the present invention.

FIG. 3B is a timing diagram illustrating a method of forming a pre first dielectric layer in a method of fabricating a semiconductor integrated circuit device according to an embodiment of the present invention.

DETAILED DESCRIPTION OF EXEMPLARY EMBODIMENTS

Figure 1:
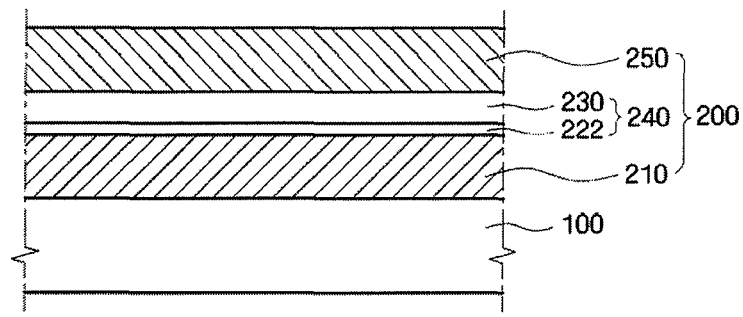
FIG. 1 is a sectional view of a semiconductor integrated circuit device according to an embodiment of the present invention.

Hereinafter, exemplary embodiments of the present invention will be described in detail with reference to the accompanying drawings. The aspects and features of embodiments of the present invention and methods for achieving the aspects and features will be apparent by referring to exemplary embodiments to be described in detail with reference to the accompanying drawings. However, embodiments of the present invention are not limited to exemplary embodiments disclosed hereinafter, but can be implemented in diverse forms. The matters defined in the description, such as the detailed construction and elements, are nothing but specific details provided to assist those of ordinary skill in the art in a comprehensive understanding of embodiments of the invention, and the present invention is only defined within the scope of the appended claims.

The term "connected to" or "coupled to" that is used to designate a connection or coupling of one element to another element includes both a case that an element is "directly connected or coupled to" another element and a case that an element is connected or coupled to another element via still another element. In the entire description herein below, the same drawing reference numerals are used for the same elements across various figures.

Hereinafter, with reference to FIG. 1, a semiconductor integrated circuit device according to an embodiment of the present invention will be described. FIG. 1 is a sectional view of a semiconductor integrated circuit device according to an embodiment of the present invention.

Referring to FIG. 1, a capacitor 200 is formed on a semiconductor substrate 100.

The semiconductor substrate 100 may be a silicon semiconductor substrate, an SOI (Silicon On Insulator) semiconductor substrate, a gallium arsenide semiconductor substrate, a silicon germanium semiconductor substrate, a ceramic semiconductor substrate, a quartz semiconductor substrate, or a glass semiconductor substrate. A P-type semiconductor substrate may be used as the semiconductor substrate 100, and a P-type epitaxial layer may be grown on an upper part of the semiconductor substrate 100.

On the other hand, although not illustrated in the drawing, transistors, interlayer insulating layers, contact holes, metal lines, and the like, may be formed on the semiconductor substrate 100. Since this is apparent to one of ordinary skill in the art to which embodiments of the present invention pertain, the detailed description thereof will be omitted.

The capacitor 200 includes a lower electrode 210, a multilayer dielectric layer 240, and an upper electrode 250.

The lower electrode 210 may be formed of, for example, TiN, TiAlN, TaN, W, WN, Ru, $RuO_2$, $SrRuO_3$, Ir, $IrO_2$, and Pt, or a combination thereof. Although not illustrated in the drawing, the lower electrode 210 may be connected to a conduction region, such as a source/drain region of a transistor formed on the semiconductor substrate 100, via a contact hole.

On the lower electrode 210, the multilayer dielectric layer 240 is provided. The multilayer dielectric layer 240 includes a first dielectric layer 222 and a second dielectric layer 230.

The first dielectric layer 222 may be formed of a metal oxynitride layer. The first dielectric layer 222 may be formed by oxynitriding a metal, such as Hf, Al, Zr, La, Ba, Sr, and Pb. Here, the first dielectric layer 222 may be formed by oxidizing the metal nitride layer formed on the lower electrode 210. For example, in the case of forming the first dielectric layer 22 through oxynitriding ZrN, $ZrON_x$ may be formed. The thickness of the first dielectric layer 22 may be in the range of about 5 to about 30 Å.

On the first dielectric layer 222, the second dielectric layer 230 is formed. The second dielectric layer 230 may be a metal oxide layer formed by oxidizing a metal such as Hf, Al, Zr, La, Ba, Sr, and Pb. On the other hand, the second dielectric layer 230 may have a laminated structure obtained by selecting and laminating two or more of metal layers resulting from the oxidization of the aforementioned metals. For example, the second dielectric layer 230 may be a ZAZ layer formed by laminating a zirconium oxide layer ZrO, an aluminum oxide layer AlO, and a zirconium oxide layer ZrO.

On the other hand, the first dielectric layer 222 and the second dielectric layer may be formed in-situ.

The first dielectric layer 222 may serve as a barrier layer that protects the lower electrode 210 in the oxidization process that forms the second dielectric layer 230. That is, in the case of forming a metal oxynitride dielectric layer 222 on the lower electrode 210, the lower electrode 210 is prevented from being oxidized in the oxidization process that forms the second dielectric layer 230. On the other hand, if the lower electrode 210 is exposed in the oxidization process of the second dielectric layer 230, the lower electrode 210 oxidizes, and the oxidized region on the upper part of the lower electrode 210 thickens. However, in a semiconductor integrated circuit device according to an embodiment of the present invention, the first dielectric layer 222 is formed to be quite thin, e.g. with a thickness of 5 to 30 Å, and the first dielectric layer 222 oxidizes during the oxidization process for forming the second dielectric layer 230. Accordingly, an unintentional increase of the EOT may be prevented.

More specifically, consider the non-limiting example of the lower electrode 210 being formed of TiN and the first dielectric layer 22 being made of $ZrON_x$. If the first dielectric layer 222 is not formed when the lower electrode 210 is made of TiN, an upper part of the TiN oxidizes in the oxidization process that form the second dielectric layer 230, and thus $TiON_x$ may be formed. However, when the first dielectric layer 222 is made with $ZrON_x$, the first dielectric layer 222 serves as a barrier layer to prevent the lower electrode 210 from being oxidized. Here, since $ZrON_x$, which is the first dielectric layer 222, oxidizes during the oxidization process that forms the second dielectric layer 230 after ZrO is formed on the lower electrode 210, the lower electrode 210 is not exposed in the oxidization process. On the other hand, in comparing the electrical properties of $TiON_x$ with those of $ZrON_x$, the electrical properties of the ZrONx layer are superior to the electrical properties of the $TiON_x$ layer. Although $TiO_2$ is known to have a high dielectric constant, it acts similar to a resistor, and thus it has an undesirable leakage current. By contrast, the $ZrON_x$ dielectric layer has a uniform dielectric constant, and has a leakage current similar to that of a ZrOCN dielectric layer. That is, in comparison to $TiON_x$, the leakage current properties of $ZrON_x$ are superior to that of $TiON_x$.

On the second dielectric layer 230, the upper electrode 250, which is in contact with the second dielectric layer 230, is formed. The upper electrode 250 may be formed of, for example, TiN, TiAlN, TaN, W, WN, Ru, $RuO_2$, $SrRuO_3$, Ir, $IrO_2$, and Pt, or a combination thereof. Although not illustrated in the drawing, the upper electrode 250 may be connected to a metal line formed on the semiconductor substrate 100 through a contact hole.

In a semiconductor integrated circuit device according to an embodiment of the to present invention, the multilayer dielectric layer 240 is formed between the lower electrode 210 and the upper electrode 250, and the first dielectric layer 222, which is in contact with the lower electrode 210, is formed of a metal oxynitride layer to protect the lower electrode 210 during the oxidization process for forming the second dielectric layer 230. Also, the first dielectric layer 222 is formed with a minimum thickness to prevent an increase of the EOT.

Accordingly, a multilayer dielectric layer 240 of a semiconductor integrated circuit device according to an embodiment of the present invention, in which the first dielectric layer 222 and the second dielectric layer 230 are laminated, prevents the oxidization of the lower electrode 210, maintains a thin EOT, and reduces the leakage current.

Figure 2:
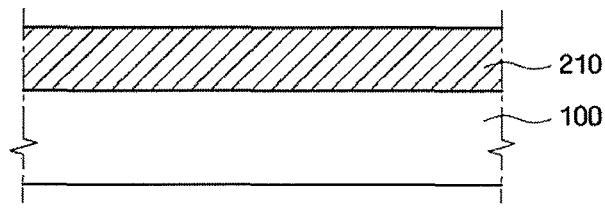
Figure 3A:
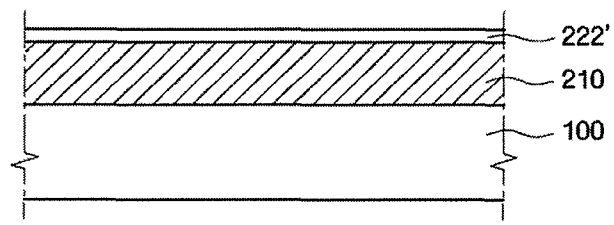
Figure 4B:
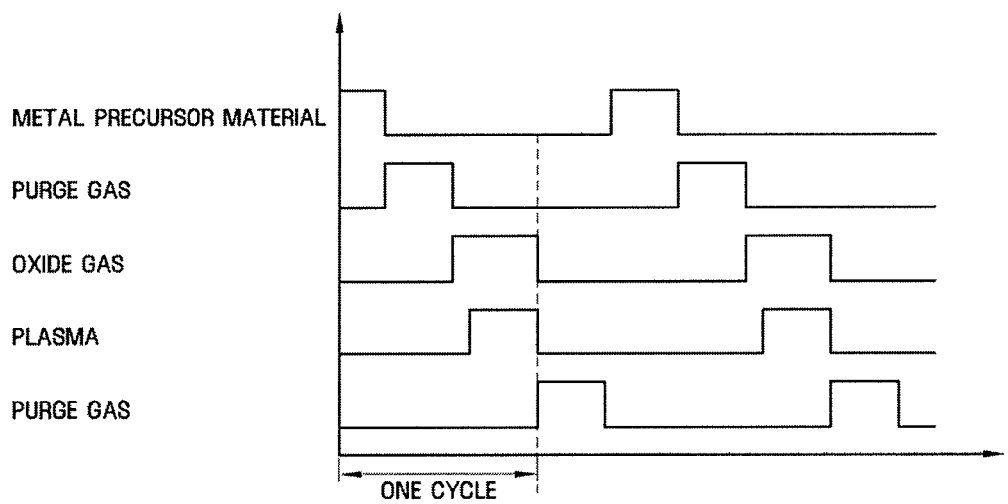
FIG. 4B is a timing diagram illustrating a method of forming a second dielectric layer in a method of fabricating a semiconductor integrated circuit device according to an embodiment of the present invention.

Hereinafter, with reference to FIGS. 2 to 4, a method of fabricating a semiconductor integrated circuit device according to an embodiment of the present invention will be described. FIGS. 2, 3A and 4A are sectional views illustrating a method of fabricating a semiconductor integrated circuit device according to an embodiment of the present invention. FIG. 3B is a timing diagram illustrating a method of forming a pre first dielectric layer in a method of fabricating a semiconductor integrated circuit device according to an embodiment of the present invention, and FIG. 4B is a timing diagram illustrating a method of forming a second dielectric layer in a method of fabricating a semiconductor integrated circuit device according to an embodiment of the present invention.

First, referring to FIG. 2, the lower electrode 210 is formed on the semiconductor substrate 100. The lower electrode 210 may be formed of, for example, TiN, TiAlN, TaN, W, WN, Ru, $RuO_2$, $SrRuO_3$, Ir, $IrO_2$, and Pt, or a combination thereof.

Referring to FIG. 3A, the pre first dielectric layer 222' is formed on the lower electrode 210. The pre first dielectric layer 222' may be a metal nitride layer, and the pre first dielectric layer 222' may be formed by a plasma enhanced atomic layer deposition (PEALD) process.

Hereinafter, with reference to FIGS. 3A and 3B, the forming of the pre first dielectric layer 222' on the lower electrode 210 will be described in more detail. In this non-limiting example, the pre first dielectric layer 222' is formed of ZrN.

First, in a chamber in which a PEALD process can be performed, the semiconductor substrate 100 on which the lower electrode 210 is formed is positioned. Then, after properly adjusting the temperature and pressure in the chamber, a zirconium precursor material is supplied into the chamber. Here, the zirconium precursor material may be TEMAZ (Tetrakis Ethyl Methyl Amino Zirconium), TDMAZ (Tetrakis Di-Methyl Amino Zirconium), TDEAZ (Tetrakis Di-Ethyl Amino Zirconium), $Zr(OtBu)_4$, $ZrCl_4$, or the like. Accordingly, the zirconium precursor material is adsorbed onto the lower electrode 210.

Then, by supplying a purge gas, such as $N_2$, He, or Ar gas, into the chamber, the remaining precursor material is removed from the chamber.

Then, a nitride gas is supplied into the chamber. The nitride gas may be, for example, $N_2$, $NH_3$, NO, $N_2O$, or the like. After the nitride gas is supplied into the chamber, a plasma voltage is applied into the chamber to form a plasma. Once the plasma is formed within the chamber, the reaction of a layer material to be formed can be accelerated. That is, after the nitride gas is supplied and the plasma is formed within the chamber, the zirconium precursor material adsorbed on the lower electrode 210 is nitrided to form ZrN.

Then, by supplying a purge gas, for example, $N_2$, He, or Ar gas, into the chamber, the nitride gas remaining in the chamber is removed.

By repeating the above-described process steps, ZrN, which is the pre first dielectric layer 222', is continuously laminated onto the lower electrode 210. By adjusting the number of repetitions of the above process, the thickness of the pre first dielectric layer 222' can be adjusted. The relative timings of the metal precursor material, the first purge gas, the nitride gas, the formation of the plasma, and the second purge gas, during one cycle, are illustrated in FIG. 3B.

Then, referring to FIG. 4A, the second dielectric layer 230 is formed on the pre first dielectric layer 222'.

The second dielectric layer 230 may be a metal oxynitride layer, and may be formed in-situ within the same chamber after the pre first dielectric layer 222' is formed.

Hereinafter, with reference to FIGS. 4A and 4B, the forming of the second dielectric layer 230 on the lower electrode 210 will be described in more detail. In this non-limiting example, a ZAZ layer is formed as the second dielectric layer 230. FIG. 4B is an exemplary timing diagram when the oxide layer is deposited, which can be either ZrO or AlO.

After forming the pre first dielectric layer 222', the zirconium precursor material is supplied into the chamber. Here, the zirconium precursor material may be TEMAZ (Tetrakis Ethyl Methyl Amino Zirconium), TDMAZ (Tetrakis Di-Methyl Amino Zirconium), TDEAZ (Tetrakis Di-Ethyl Amino Zirconium), $Zr(OtBu)_4$, $ZrCl_4$, or the like. Accordingly, the zirconium precursor material is adsorbed onto the pre first dielectric layer 222'.

Then, by supplying a purge gas, such as $N_2$, He, or Ar gas, into the chamber, the remaining precursor material is removed from the chamber.

Then, an oxide gas is supplied into the chamber. The oxide gas may be, for example, $O_2$, $O_3$, $N_2O$, or the like. After the oxide gas is supplied into the chamber, a plasma voltage is applied into the chamber to form the plasma. Once the oxide plasma is formed within the chamber, the reaction of a layer material to be formed can be accelerated. That is, after the oxide gas is supplied and the plasma is formed within the chamber, the zirconium precursor material adsorbed on the pre first dielectric layer 222' is oxidized to form a zirconium oxide layer ZrO.

Then, by supplying a purge gas, such as $N_2$, He, or Ar gas, into the chamber, the remaining oxide gas is removed from the chamber.

By repeating the above-described process steps, a zirconium oxide layer is formed on the pre first dielectric layer 222' with a proper thickness. The relative timings of the metal precursor material, the first purge gas, the oxide gas, the formation of the plasma, and the second purge gas, during one cycle, are illustrated in FIG. 4B.

Then, an aluminum precursor material is supplied into the chamber. Here, the aluminum precursor material may be, for example, TMA (Tri Methyl Aluminum), DMAH (Di Methyl Aluminum Hydride), DMAH-EPP (Di Methyl Aluminum Hydride Ethyl PiPeridine), or the like.

Then, by supplying a purge gas, such as $N_2$, He, or Ar gas, into the chamber, the remaining precursor material is removed from the chamber, and then by supplying an oxide gas into the chamber and forming a plasma, an aluminum oxide (AlO) layer is formed. Then, by supplying a purge gas, such as $N_2$, He, or Ar gas, into the chamber, the remaining oxide gas is removed from the chamber.

By repeating the above-described process steps, an aluminum oxide layer is formed on the zirconium oxide layer with a proper thickness.

Then, the second dielectric layer 230, which is composed of a zirconium oxide (ZrO) layer/aluminum oxide (AlO) layer/zirconium oxide (ZrO) layer, is formed.

The process of forming the second dielectric layer 230 includes an oxidization process. That is, the oxide gas is continuously supplied onto the semiconductor substrate 100 on which the pre first dielectric layer 222' is formed. In this case, the pre first dielectric layer 222', which is a metal nitride layer, is oxidized by the oxide gas, and thus the first dielectric layer 222, which is a metal oxynitride layer, is formed. If the pre first dielectric layer 222' is ZrN, the first dielectric layer 222, which is ZrON, is formed through nitridization of ZrN. In this case, the first dielectric layer 222 prevents the lower electrode 210 from being affected by the oxide gas. That is, the first dielectric layer 222 serves as a barrier layer with respect to the lower electrode 210. Since $ZrON_x$ has a dielectric constant of 20 to 30, it has a superior dielectric property, and thus can function as a good quality dielectric layer.

Then, referring again to FIG. 1, the capacitor 200 is completed by forming the upper electrode 250 on the second dielectric layer 230. The upper electrode 250 may be, for example, TiN, TiAlN, TaN, W, WN, Ru, $RuO_2$, $SrRuO_3$, Ir, $IrO_2$, and Pt, or a combination thereof.

Figure 5:
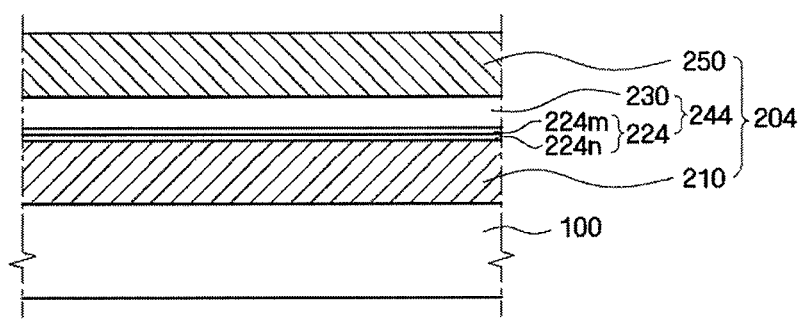
FIG. 5 is a sectional view of a semiconductor integrated circuit device according to another embodiment of the present invention.

Hereinafter, with reference to FIG. 5, a semiconductor integrated circuit device according to another embodiment of the present invention will be described. FIG. 5 is a sectional view of a semiconductor integrated circuit device according to another embodiment of the present invention.

Referring to FIG. 5, according to another embodiment of the present invention, unlike a semiconductor integrated circuit device according to an embodiment of FIGS. 1 to 4, a first dielectric layer 224, which forms a multilayer dielectric layer 244 of a capacitor 204, is formed as a laminated structure of a metal nitride layer 224n and a metal oxynitride layer 224m. Since other constituent elements and the fabricating method according to another embodiment of the present invention are the same as for a semiconductor integrated circuit device and fabricating method thereof according to an embodiment of FIGS. 1 to 4, the detailed description thereof will be omitted.

A semiconductor integrated circuit device according to another embodiment of the present invention includes the first dielectric layer 224 having a structure in which the metal nitride layer 224n and the metal oxynitride layer 224m are laminated. The first dielectric layer 224 may be formed, for example, by nitriding and oxynitriding a metal such as Hf, Al, Zr, La, Ba, Sr, and Pb. For example, if the first dielectric layer 224 is formed using Zr, the first dielectric layer 224 may be formed as a structure in which ZrN and $ZrON_x$ are laminated.

In this case, the first dielectric layer 224 formed as a laminated structure of the metal nitride layer 224n and the metal oxynitride layer 224m is fabricated by forming the metal oxynitride layer 224m, such as $ZrON_x$, by oxidizing part of the metal nitride layer 224n, such as ZrN, after the metal nitride layer 224n is formed.

Figure 6:
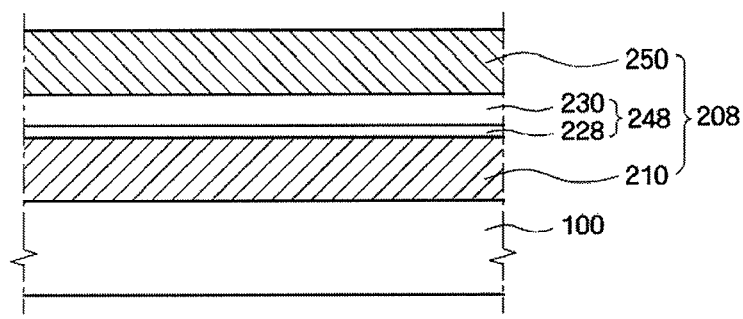
FIG. 6 is a sectional view of a semiconductor integrated circuit device according to still another embodiment of the present invention.

Hereinafter, with reference to FIG. 6, a semiconductor integrated circuit device according to still another embodiment of the present invention will be described. FIG. 6 is a sectional view of a semiconductor integrated circuit device according to still another embodiment of the present invention.

Referring to FIG. 6, according to still another embodiment of the present invention, unlike the semiconductor integrated circuit device according to an embodiment of FIGS. 1-4 and 5, a first dielectric layer 228, which forms a multilayer dielectric layer 248 of a capacitor 208, is formed as a metal nitride layer. Since other constituent elements and the fabricating method according to still another embodiment of the present invention are the same as for a semiconductor integrated circuit device and fabricating method thereof according to an embodiment of FIGS. 1-4 and 5, the detailed description thereof will be omitted.

A semiconductor integrated circuit device according to still another embodiment of the present invention includes the first dielectric layer 228 formed of a metal nitride layer. The first dielectric layer 228 may be formed, for example, by nitriding a metal such as Hf, Al, Zr, La, Ba, Sr, and Pb. For example, if the first dielectric layer 228 is formed using Zr, the first dielectric layer 228 may be formed of ZrN.

On the other hand, in a semiconductor integrated circuit device according other embodiments of the present invention, at least a part of the first dielectric layer 228 is oxidized in the process of forming the second dielectric layer 230. However, in this embodiment of the present invention, the first dielectric layer 228 in the form of a metal nitride layer can be formed by preventing the oxidization of the first dielectric layer 228 in under proper process conditions.

A semiconductor integrated circuit device according to embodiments of the present invention may include diverse types of capacitors, such as flat type capacitors, cylinder type capacitors, and the like.

Figure 7:
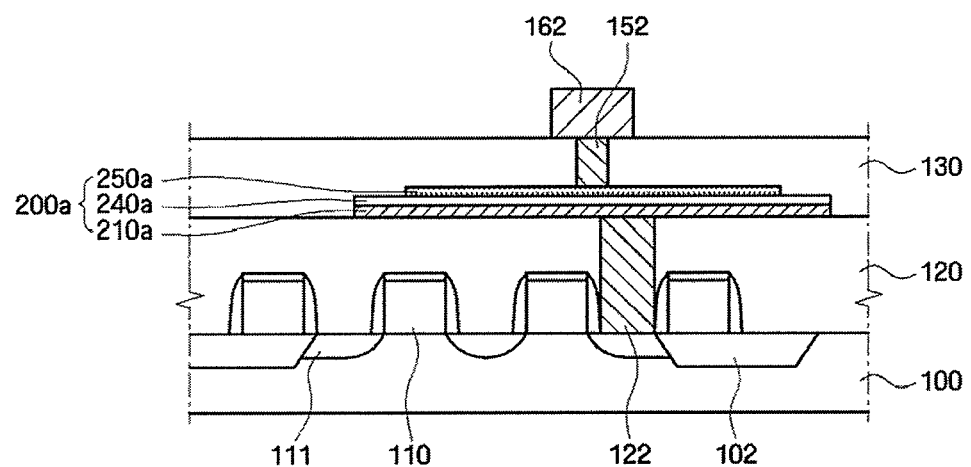
FIG. 7 is a view illustrating a semiconductor integrated circuit device in the case in which the semiconductor integrated circuit device is implemented by a flat type capacitor according to embodiments of the present invention.

FIG. 7 is a view illustrating a semiconductor integrated circuit device in the case in which a semiconductor integrated circuit device is implemented by a flat type capacitor according to embodiments of the present invention.

Referring to FIG. 7, an isolation layer 102 for dividing an active region and a field region from each other is formed on the semiconductor substrate 100, and gate electrodes 110 are positioned on the semiconductor substrate 100. Also, on the semiconductor substrate 100, a source/drain region 111 is positioned in alignment with the gate electrodes 110. A first interlayer insulating layer 120 is formed on the semiconductor substrate 100 on which the gate electrodes 110 are formed.

A first contact 122 may be formed on an upper part of the source/drain region 111 on the first interlayer insulating layer 120. The first contact 122 electrically connects the source/drain region 111 of the semiconductor device 100 to a lower electrode 210a of a flat type capacitor 200a. Also, inside the first interlayer insulating layer 120, a bit line contact (not illustrated) is formed that is electrically connected to another source/drain region 111 of the semiconductor substrate 100.

A second interlayer insulating layer 130 is formed on the first interlayer insulating layer 120, and in the second interlayer insulating layer 130, the flat type capacitor 200a is formed that is electrically connected to the first contact 122.

The flat type capacitor 200a includes a lower electrode 210a formed on an upper part of the first contact 122, a multilayer dielectric layer 240a, and an upper electrode 250a. A contact 152 connects the upper electrode 250a to an interconnection 162. The flat type capacitor 200a may include a multilayer dielectric layer 240a according to embodiments of the present invention as described above.

Figure 8:
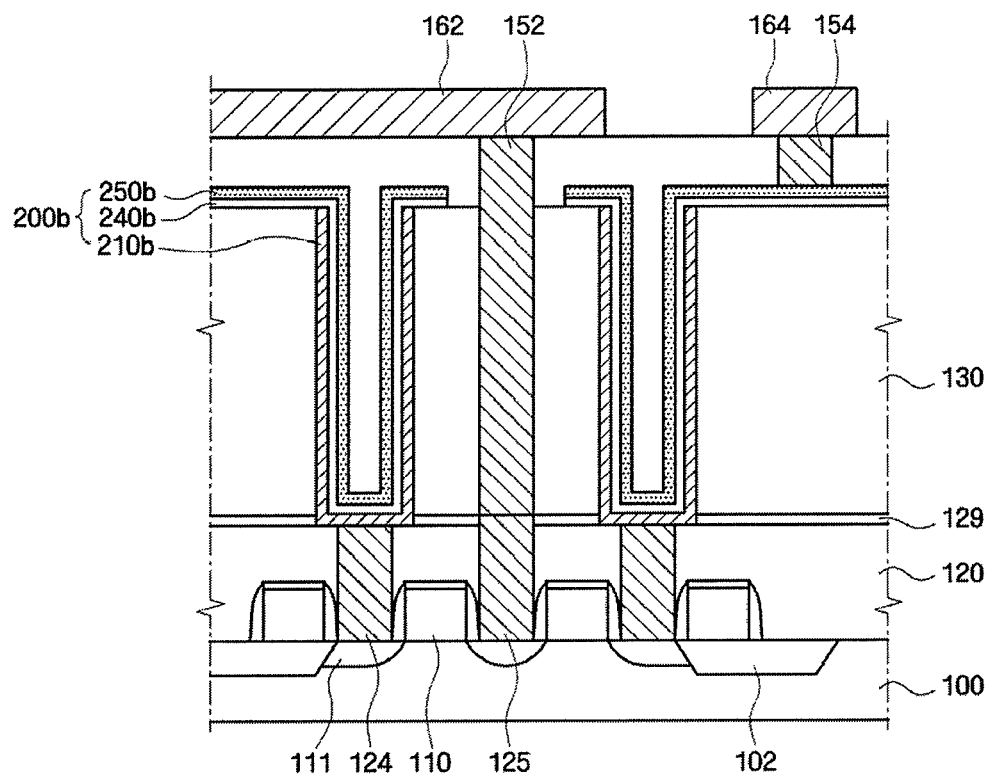
FIG. 8 is a view illustrating a semiconductor integrated circuit device in the case in which the semiconductor integrated circuit device is implemented by a cylinder type capacitor according to embodiments of the present invention.

FIG. 8 is a view illustrating a semiconductor integrated circuit device in the case in which a semiconductor integrated circuit device is implemented by a cylinder type capacitor according to embodiments of the present invention.

Referring to FIG. 8, an isolation layer 102 for dividing an active region and a field region from each other is formed on the semiconductor substrate 100, and gate electrodes 110 are positioned on the semiconductor substrate 100. Also, on the semiconductor substrate 100, a source/drain region 111 is positioned in alignment with the gate electrodes 110.

A first interlayer insulating layer 120 is formed on the semiconductor substrate 100 on which the gate electrodes 110 are formed, and in the first interlayer insulating layer 120, a first contact 124 is formed which electrically connects the source/drain region 111 to a lower electrode 210b of a cylinder type capacitor 200b. Also, inside the first interlayer insulating layer 120, a first bit line contact 125 is formed that is electrically connected to another source/drain region 111 of the semiconductor substrate 100.

On an upper part of the first interlayer insulating layer 120, an etch stop layer 129 is formed, and on an upper part of the etch stop layer 130, a second interlayer insulating layer 130 is formed. A second bit line contact 152 that is connected to a bit line 162 is formed on an upper part of the first bit line contact 125 in the second interlayer insulating layer 130.

On an upper part of the first contact 124, the cylinder type capacitor 200b is formed. The capacitor 200b includes a lower electrode 210b, a multilayer dielectric layer 240b, and an upper electrode 250b. A contact 154 connects the upper electrode 250b to an interconnection 164. Here, the cylinder type capacitor 200b may include the multilayer dielectric layer 240b according to embodiments as described above.

More details of embodiments of the present invention will be described through the following concrete experimental examples. Since content not described here can be inferred by one skilled in the art, the description thereof will be omitted.

Figure 9:
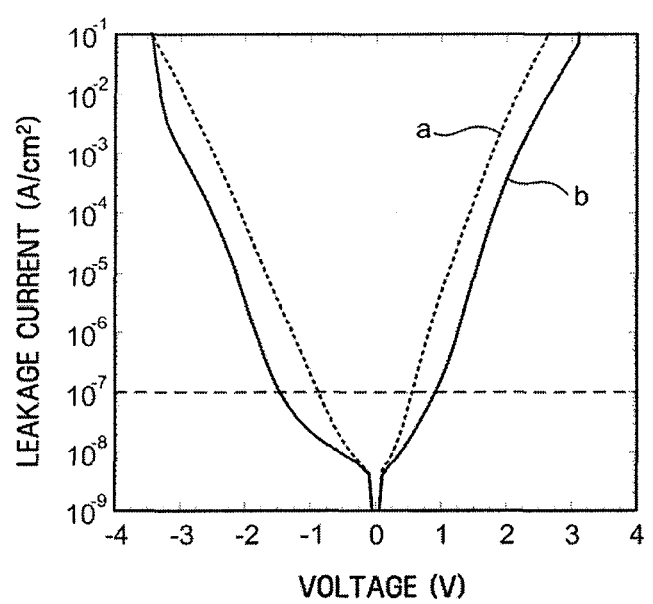
FIG. 9 is a graph illustrating leakage current measured as changing a voltage being applied between both ends of a lower electrode and an upper electrode according to embodiments of the present invention.

FIG. 9 is a graph illustrating leakage current as a function of a voltage change applied between the lower electrode and the upper electrode according to embodiments of the present invention. The reference letter "a" indicates a case in which a ZAZ layer is formed as a dielectric layer, and "b" indicates a case in which a ZrN-ZAZ layer is formed as a dielectric layer.

Specifically, according to case "a", on a lower electrode formed of a TiN layer, a ZAZ layer was formed as a dielectric layer, and a TiN layer was formed on the ZAZ layer as the upper electrode. In this case, using an ALD device, respective layer materials were formed by depositing a TiN layer, which is an upper electrode, in 42 deposition cycles, a ZAZ layer in 3 cycles, and a TiN layer, which is a lower electrode, in 14 cycles, respectively. At that time, the EOT of the dielectric layer was measured as 9.0 Å.

According to case "b", on a lower electrode formed of a TiN layer, a ZrN layer was formed, and a ZAZ layer was formed in-situ to complete the dielectric layer. On the ZAZ layer, a TiN layer was formed as an upper electrode. In this case, using an ALD device, respective layer materials were formed by depositing a TiN layer, which is an upper electrode, in 42 deposition cycles, a ZrN layer in 5 cycles, a ZAZ layer in 3 cycles, and a TiN layer, which is a lower electrode, in 14 cycles, respectively. At that time, the EOT of the dielectric layer was measured as 9.2 Å.

That is, the EOT values in "a" and "b" were similar to each other.

Then, the leakage current was measured while changing the voltage applied between the lower electrode and the upper electrode. The result of measurement is shown in FIG. 9. In FIG. 9, x-axis represents a voltage that is applied between the lower electrode and the upper electrode, and y-axis represents leakage current expressed in units of $A/cm^2$.

Referring to FIG. 9, it can be recognized that case 'b' has improved leakage current behavior with respect to case 'a'. Specifically, in the case in which the leakage current is 100 $nA/cm^2$, voltages applied between both ends of the lower electrode and the upper electrode in "a" and "b" are summarized as in Table 1 below.

TABLE 1

| a (ZAZ) | b (ZrN + ZAZ) |
|---|---|
| −0.9 V/0.6 V | −1.5 V/0.9 V |

Referring to Table 1, the voltage whereby the leakage current of 100 nA/cm2 is generated in "b" is higher than that in "a". That is, the EOT in "a" in which the dielectric layer is formed of a ZAZ layer is similar to the EOT in "b" in which the dielectric layer is formed of ZrN+ZAZ layers, but the leakage current behavior in "b" is superior to the leakage current behavior in "a". Accordingly, the case of forming the ZrN layer before forming the ZAZ layer, has improved the capacitor's electrical properties.

In the foregoing description, an exemplary multilayer dielectric layer is described as interposed between a lower electrode and an upper electrode of a capacitor. However, other embodiments of the present invention are not limited thereto. In other embodiments, the multilayer dielectric layer could have been used as a gate insulating layer or an interlayer dielectric layer that constitutes a respective memory cell, such as a tunnel dielectric layer, a blocking dielectric layer, and the like, in a flash memory device. For example, in other embodiments, where the dielectric layer is used in a semiconductor device such as a flash memory device, deterioration of the semiconductor device can be prevented, and leakage current can be substantially reduced to improve reliability.

Although exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A semiconductor integrated circuit device comprising:
   a lower electrode formed on a substrate;
   a first layer formed of one selected from a group consisting of a metal nitride layer, a metal oxynitride layer, or a combination thereof, on the lower electrode;
   a dielectric layer formed on the first layer that includes a zirconium oxide layer, an aluminum oxide layer and a zirconium oxide layer which are sequentially laminated on the zirconium oxide layer to form a ZAZ layer, wherein said ZAZ layer is laminated on the first layer; and
   an upper electrode formed on the dielectric layer.

2. The semiconductor integrated circuit device of claim 1, wherein the first layer is formed by nitriding a metal selected from the group consisting of Hf, Al, Zr, La, Ba, Sr, and Pb, and oxidizing the metal nitride formed thereof.

3. The semiconductor integrated circuit device of claim 1, wherein the first layer is formed as a laminated structure of a metal nitride layer and a metal oxynitride layer.

4. The semiconductor integrated circuit device of claim 3, wherein the first layer is formed by nitriding and oxynitriding a metal selected from the group consisting of Hf, Al, Zr, La, Ba, Sr, and Pb.

5. The semiconductor integrated circuit device of claim 1, wherein the first layer is formed of a metal nitride layer by nitriding a metal selected from the group consisting of Hf, Al, Zr, La, Ba, Sr, and Pb.

6. The semiconductor integrated circuit device of claim 1, wherein the lower electrode is made of TiN.

7. A semiconductor integrated circuit device comprising:
   a lower electrode formed on a substrate;
   a first layer formed of a combination of a zirconium nitride layer and a zirconium oxynitride layer on the lower electrode;
   a dielectric layer that includes one or more metal oxide layers formed on the first layer; and
   an upper electrode formed on the dielectric layer.

8. The semiconductor integrated circuit device of claim 7, wherein the one or more metal oxide layers of the dielectric layer are formed by oxidizing metals selected from the group consisting of Hf, Al, Zr, La, Ba, Sr, and Pb.

9. The semiconductor integrated circuit device of claim 7, wherein the lower electrode is made of TiN.

10. The semiconductor integrated circuit device of claim 8, wherein the lower electrode is made of TiN.

* * * * *